United States Patent
Samavati (10) Patent No.: US 7,482,852 B1
(45) Date of Patent: Jan. 27, 2009

(54) INDUCTOR-LESS LOCAL OSCILLATOR BUFFER

(75) Inventor: Hirad Samavati, Santa Clara, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 83 days.

(21) Appl. No.: 11/468,723

(22) Filed: Aug. 30, 2006

Related U.S. Application Data (60) Provisional application No. 60/719,417, filed on Sep. 21, 2005.

(51) Int. Cl.
*G06G 7/12* (2006.01)
(52) U.S. Cl. .................. 327/359; 327/358; 327/355; 455/333
(58) Field of Classification Search ......... 427/355–362; 455/326, 333
See application file for complete search history.

(56) References Cited

U.S. PATENT DOCUMENTS 7,027,783 B2 * 4/2006 Vilhonen et al. ............ 455/118
7,031,668 B2 * 4/2006 Darabi et al. ............... 455/75
7,161,406 B1 * 1/2007 Ferris ......................... 327/359

OTHER PUBLICATIONS

Keaveney et al. "A 10 μs Fast Switching PLL Synthesizer for a GSM/EDGE Base-Station", ISSCC Dig. Tech. Papers, pp. 192-193, Feb. 2004.
Mehta et al. "An 802.11g WLAN SoC", ISSCC Dig. Tech. Papers, pp. 94-95, Feb. 2005.
Mostafa et al. "A 1.9 GHz SiGe Bi CMOS PHS Transceiver with an Integrated PA and a Fast Settling PLL", 2005 RFIC Symposium, pp. 277-280, Jun. 2005.
Staszewski et al. "All Digital PLL and GSM/EDGE Transmitter in 90nm CMOS". ISSCC Dig. Tech. Papers, pp. 316-317, Feb. 2005.

* cited by examiner

*Primary Examiner*—Dinh T. Le
(74) *Attorney, Agent, or Firm*—Bever, Hoffman & Harms, LLP; Jeanette S. Harms (57) ABSTRACT

An N-stage inductor-less local oscillator (LO) buffer can include N−1 non-final stages and a final stage. The final stage can includes a gain circuit, a common-mode feedback circuit connected to the gain circuit, and a replica bias circuit that provides a predetermined voltage to the common-mode feedback circuit. The inductor-less LO buffer can advantageously reduce a power budget for its downstream mixer as well as provide a compact footprint.

12 Claims, 10 Drawing Sheets

| Performance Summary Chart 800 | |
| --- | --- |
| Power Dissipation<br>    RF Transmitter<br>    RF Receiver<br>    RF Synthesizer<br>    Talk Mode (1/8 Tx; 1/8 Rx)<br>    Standby Mode | <br>29 mA<br>30 mA<br>25 mA<br>81 mA (including audio and digital)<br>1 mA (including audio and digital) |
| Phase Noise @ 1.9 GHz | -118 dBc/Hz @ 600 kHz offset |
| Settling Time to +/- 1 kHz | 15 μs |
| Receive Sensitivity | -106 dBm |
| Receiver Noise Figure | 3.5 dB |
| Transmit Power (EVM Compliant) | +4 dBm |
| Transmit EVM @ +1dBm | 4% |

INDUCTOR-LESS LOCAL OSCILLATOR BUFFER

RELATED APPLICATIONS

This application claims priority of U.S. Provisional Patent Application 60/719,417, entitled "SoC For A PHS Handset" filed Sep. 21, 2005.

BACKGROUND OF THE INVENTION

1. Field of the Invention

The present invention relates to an inductor-less local oscillator buffer implementable on a single-chip CMOS Personal Handy-Phone System (PHS) cellphone.

2. Related Art

The Personal Handy-Phone System (PHS) is a popular mobile network system of cells currently used in urbanized areas of China, Taiwan, and Vietnam. PHS cells are relatively small (e.g. on the order of 10-100 meters) and require relatively low power base stations (e.g. 500 mW). Currently, PHS operates in the 1880-1930 MHz frequency band.

One problem associated with a PHS cellphone receiver is that much of the power budgeted for the receiver is expended in its mixers. Another problem associated with a PHS cellphone receiver is that the local oscillator (LO) buffers providing I and Q signals to the mixers typically include inductors and coupling capacitors, both of which take significant space, for example die area. Therefore, a need arises for a cellphone implementation that can reduce the power budget for its mixers and minimize the footprint of its LO buffers.

SUMMARY OF THE INVENTION

An N-stage inductor-less local oscillator (LO) buffer is described, wherein N is a positive integer. This inductor-less LO buffer can include N−1 non-final stages and a final stage. The final stage can includes a gain circuit, a common-mode feedback circuit connected to the gain circuit, and a replica bias circuit that provides a predetermined voltage to the common-mode feedback circuit. The inductor-less LO buffer can advantageously reduce the power budget for its downstream mixer as well as provide a compact footprint.

In one embodiment, the gain circuit can include a first transistor, a second transistor, and a first current source. The first transistor has a gate connected to either a first component of an LO input signal (if N=1) or a first output of a non-final stage (if N>1). The drain of the first transistor is connected to a first LO output terminal of the LO buffer. The second transistor has a gate connected to either a second component of the LO input signal (if N=1) or a second output of the non-final stage (if N>1). The drain of the second transistor is connected to a negative LO output terminal of the LO buffer. The first current source is connected between a first voltage source (e.g. ground) and the sources of the first and second transistors.

In one embodiment, the common-mode feedback circuit can include third and fourth transistors, first and second resistors, a capacitor, and a first operational amplifier. The third transistor has a source connected to a second voltage source (e.g. VDD) and a drain connected to the positive LO output terminal. The fourth transistor has a source connected to the second voltage source and a drain connected to the negative LO output terminal. The first resistor is connected between the positive LO output terminal and a first node, whereas the second resistor is connected between the negative LO output terminal and the first node. The capacitor is connected between the gates of the third and fourth transistors and the first node. The first operational amplifier has an output terminal connected to the gates of the third and fourth transistors, a positive input terminal connected to the first node, and a negative input terminal.

The replica bias circuit can include a second operational amplifier, a second current source and a native transistor. The second operational amplifier has an output terminal connected to the negative input terminal of the first operational amplifier, a positive input terminal connected to a mixer bias voltage, and a negative input terminal. The second current source is connected between the first voltage source and the negative input terminal of the second operational amplifier. The native transistor has a gate connected to the output terminal of the second operational amplifier, a source connected to the negative input terminal of the second operational amplifier, and a drain connected to the second voltage source.

In one embodiment, each of the N−1 non-final stages can include a differential amplifier. This differential amplifier can include (without reference to the above description of the LO buffer) first and second coupling capacitors (implemented as transistors, e.g. native transistors), first through fifth transistors, and first through fourth resistors. The first coupling capacitor has a first terminal for receiving a first component of a differential input signal. Similarly, the second coupling capacitor has a first terminal for receiving a second component of the differential input signal. The first transistor has a gate connected to the second terminal of the first coupling capacitor. The second transistor has a gate connected to the second terminal of the second coupling capacitor. The third transistor has a drain connected to the sources of the first and second transistors and a source connected to a first voltage source (e.g. ground). The first resistor is connected between the second terminal of the first coupling capacitor and the gate of the third transistor. The second resistor is connected between the second terminal of the second coupling capacitor and the gate of the third transistor. The fourth transistor has a source connected to a second voltage source (e.g. VDD) and a drain connected to the drain of the first transistor. The fifth transistor has a source connected to the second voltage source, a drain connected to the drain of the second transistor, and a gate connected to the gate of the fourth transistor and a bias terminal. The third resistor is connected between the drains of the first and fourth transistors and a gate of the third transistor. Note that the drains of the first and fourth transistors provide a first differential output of the differential amplifier. The fourth resistor is connected between the drains of the second and fifth transistors and the gate of the third transistor. Note that the drains of the second and fifth transistors provide a second differential output of the differential amplifier.

DETAILED DESCRIPTION OF THE FIGURES

Figure 1:
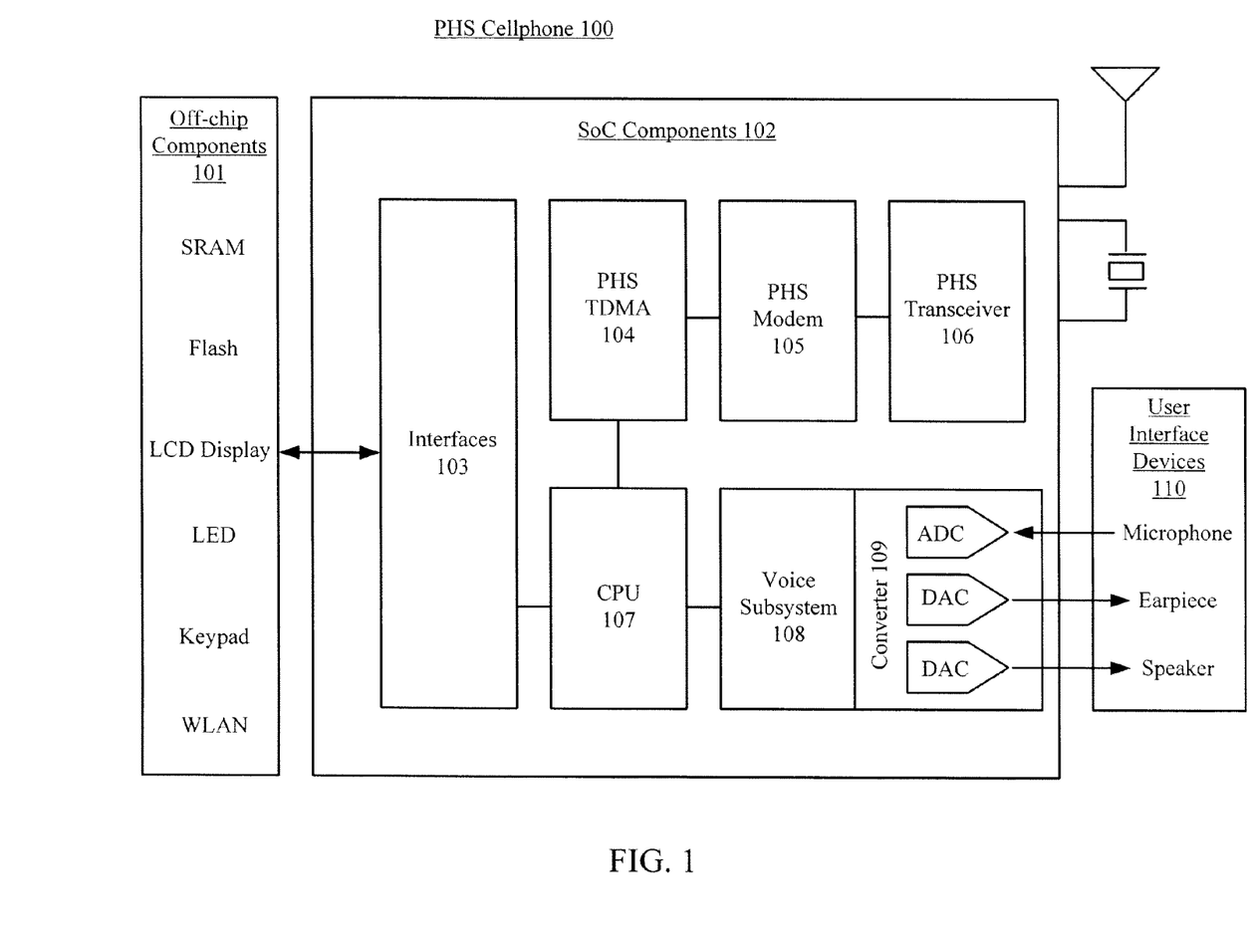
FIG. 1 illustrates a block diagram of an exemplary PHS cell phone including off-chip components, system-on-chip (SoC) components, and user interface devices.

A PHS cellphone including an inductor-less local oscillator (LO) buffer can advantageously provide a low-power, small-form factor solution. FIG. 1 illustrates an exemplary PHS cell phone 100 including off-chip components 101, system-on-chip (SoC) components 102, and user interface devices 110.

SoC components 102 can include interfaces 103 to off-chip components 101, such as memory devices (SRAM, flash, etc.), an LCD display, a keyboard, and a wireless local area network (WLAN). SoC components 102 can further include a PHS time division multiple access (TDMA) 104, a PHS modem 105, a PHS transceiver 106, a CPU 107, a voice subsystem 108, and audio/voice-band data converters 109. In one embodiment, the analog/RF components of SoC components 102 (e.g. PHS transceiver 106 and converters 109) occupy approximately one-third of the chip area, whereas the digital components, (e.g. interfaces 103, PHS TDMA 104, PHS modem 105, CPU 107, and voice subsystem 108) occupy the remaining chip area.

PHS TDMA 104 can provide TDMA functionality, which allows multiple transmitters to share the same frequency by dividing it into different timeslots. PHS modem 105 can modulate an analog carrier signal (using π/4 QPSK modulation) to encode digital information as well as demodulate such encoded information. PHS transceiver 106 can provide both transmitter and receiver functionality in the 1880.15 to 1929.65 MHz frequency band. CPU 107, which can be implemented in one embodiment using an ARM9™ processor, can interpret instructions and process data in PHS computer programs. Voice subsystem 108 may, for example, provide audio data compression, decompression, and formatting. Audio/voice-band data converters 109 can provide analog to digital (or digital to analog) conversion for user interface devices 110, such as a microphone, an earpiece, and a speaker.

Figure 2:
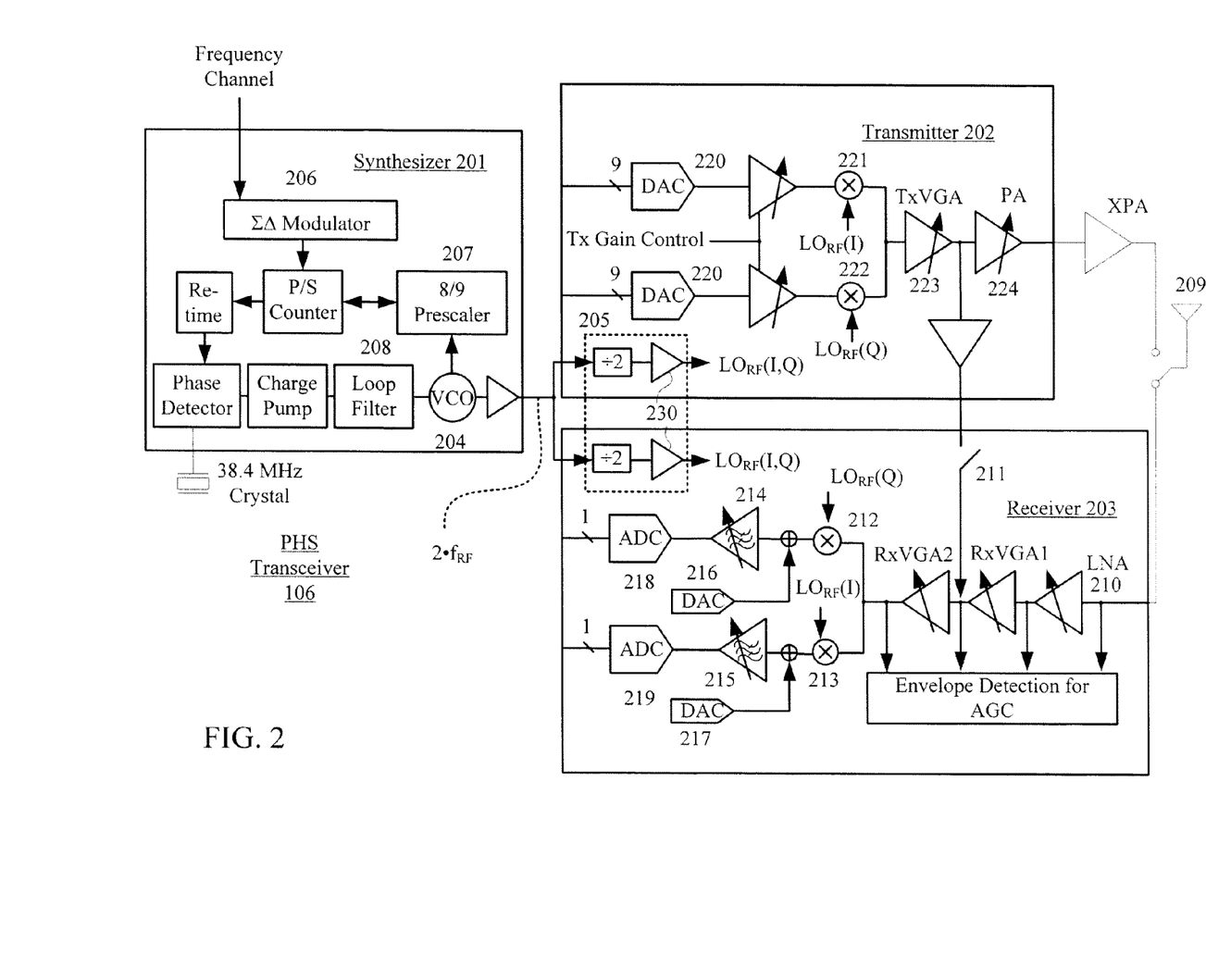
FIG. 2 illustrates a block diagram of an exemplary PHS transceiver including a synthesizer, a transmitter, and a receiver.

FIG. 2 illustrates a block diagram of an exemplary PHS transceiver 106 including a frequency synthesizer 201, a linear transmitter 202, and a linear receiver 203. In this embodiment, frequency synthesizer 201 can use a voltage-controlled oscillator (VCO) 204 that operates at twice the RF signal frequency (i.e. $2 \cdot f_{RF}$). Choosing a VCO frequency at twice the RF signal frequency is advantageous because 1) frequency pulling by transmitter 202 is weaker, 2) the size of the on-chip VCO spiral inductor is smaller, and 3) the quadrature local oscillator radio frequency ($LO_{RF}(I,Q)$) can be easily generated by a divide-by-two circuit 205. In accordance with one aspect of the invention, the two LO buffers 230 included in divide-by-two circuit 205 are implementable without using inductors. Exemplary LO buffers are further explained below in reference to FIGS. 6A, 6B, and 6C.

To support seamless handover between base stations in different cells, frequency synthesizer 201 can include a $\Sigma\Delta$ modulator 206 and an 8/9 prescaler 207, thereby ensuring fast synthesizer settling. For example, in one embodiment of frequency synthesizer 201, implemented as a 3rd order, 3-bit $\Sigma\Delta$ fractional-N synthesizer, a 15 μs settling time is achievable.

Figure 3:
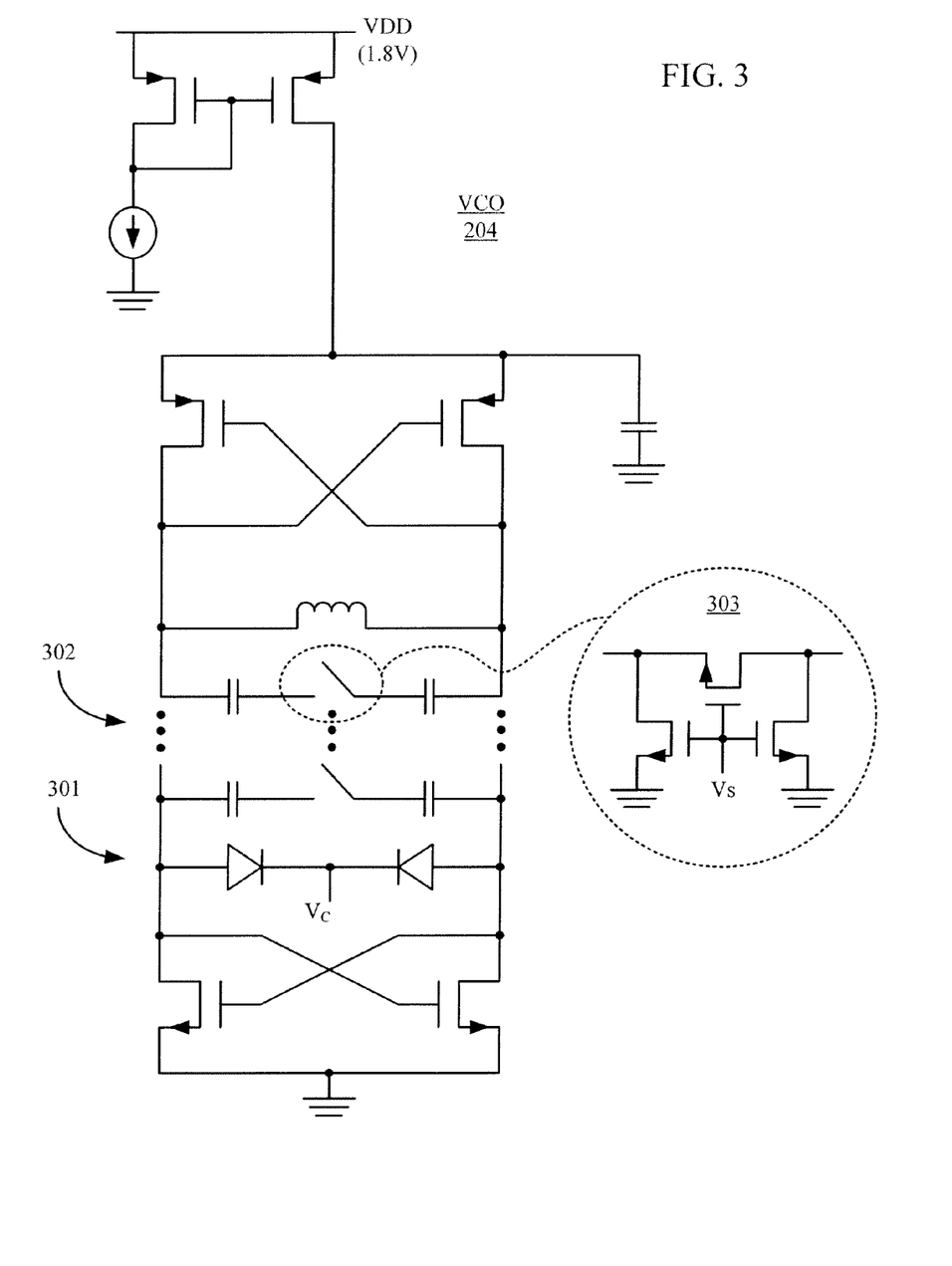
FIG. 3 illustrates an exemplary VCO implementable with varactors and an array of rows of switchable capacitors placed parallel to the varactors.

In one embodiment shown in FIG. 3, VCO 204 can be based on an LC resonant tank with varactors 301. Note that for implementation in a CMOS process, varactors 301 can be formed using a heavily positively-doped region (i.e. a p+ implant) inside a lightly positively-doped region (i.e. a pwell). The capacitance of varactors 301 is inversely proportional to the square root of control voltage Vc.

To ensure that VCO 204 can support a wide frequency range of 3760.3 to 3859.3 MHz, an array of rows of switchable capacitors 302 can be placed parallel to varactors 301. In one embodiment, the reverse bias voltage on varactors 301 is confined to a small range of 200 mV, over process and temperature corners, to provide accurate control of VCO gain ($K_{vco}$). Note that each switch 303 in a row of switchable capacitors can be formed using three NMOS transistors having gates commonly connected to receive a switch voltage Vs (wherein each row of switchable capacitors can receive an "on" or "off" switch voltage). In one embodiment, during channel switching, capacitor selection can be done using a lookup table for switch voltages, thereby eliminating any delay introduced by a capacitor search algorithm.

Referring back to FIG. 2, frequency synthesizer 201 further includes a loop filter 208 (e.g. implementable with on-chip poly-silicon resistors and NMOS capacitors) that can be used to optimize loop bandwidth by appropriately balancing settling time and phase noise. Specifically, a wide loop bandwidth can provide fast settling, whereas a low loop bandwidth can suppress $\Sigma\Delta$ quantization noise. In one embodiment of loop filter 208, the frequency zero and poles in the filter transfer function are more than a decade apart to avoid prolonged doublet settling. Moreover, the loop bandwidth of loop filter 208 can be adjusted by any of a number of methods that are well understood in the art during channel change to speed up the transient response.

Figure 4:
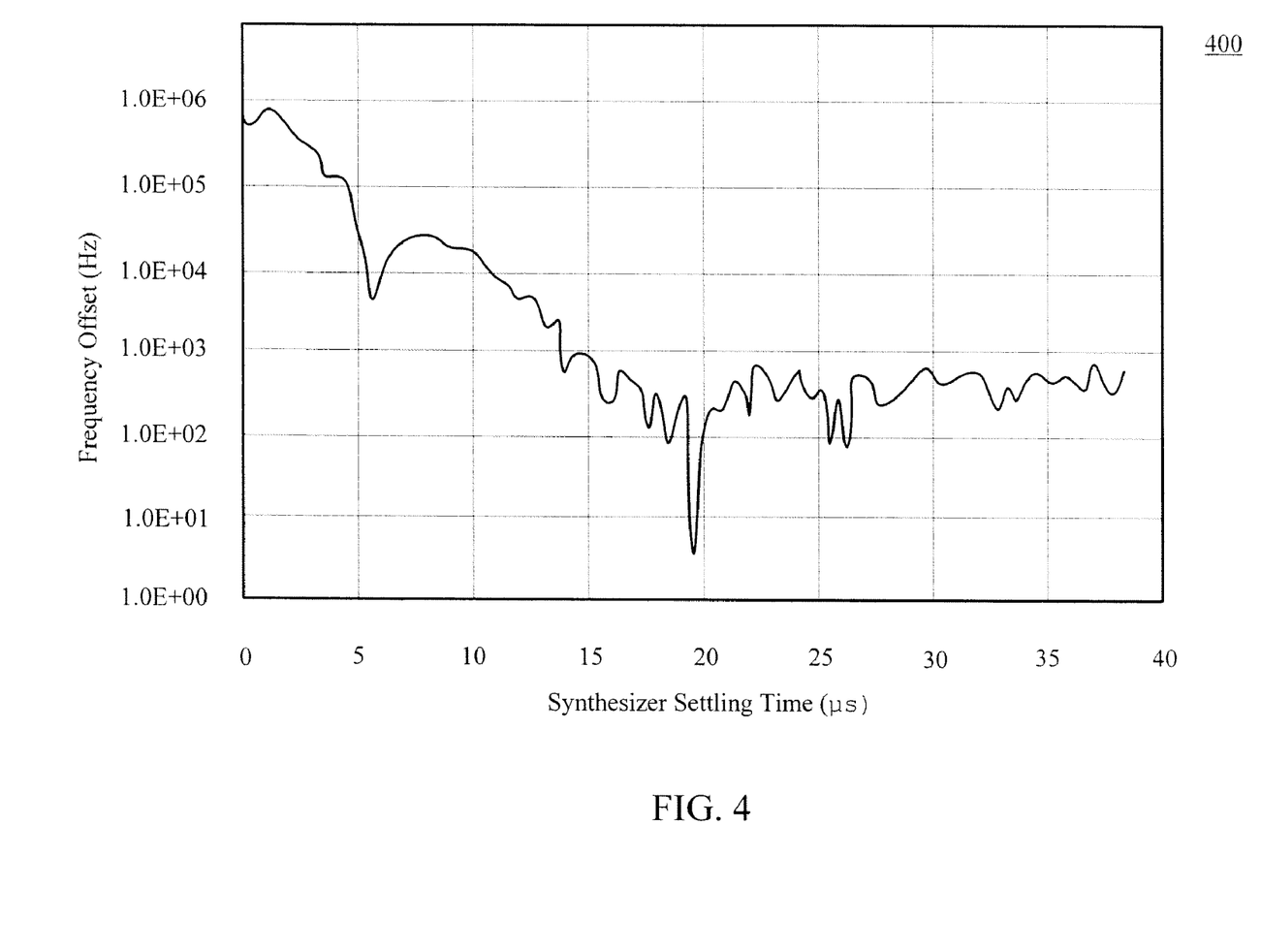
FIG. 4 illustrates a graph plotting frequency offset (Hz) versus synthesizer settling time (µs) for an exemplary loop filter when providing a 120 kHz loop bandwidth.

In one embodiment, loop filter 208 forms a third order passive RC filter that can provide a 120 kHz loop bandwidth. FIG. 4 illustrates a graph 400 plotting frequency offset (Hz) versus synthesizer settling time (μs) for loop filter 208 when providing a 120 kHz loop bandwidth. As shown in graph 400, this loop bandwidth can yield a resulting settling time (to 1 kHz) of approximately 15 μs. This fast settling time advantageously permits synthesizer settling between adjacent time slots.

Note that in a typical transceiver, two interleaving synthesizers are used (e.g. a first synthesizer is used in a first time slot, a second synthesizer is used in a second time slot, the first synthesizer is used in a third time slot, etc.). However, interleaving the use of two synthesizers has undesirable power and area penalties. In contrast, with a settling time of 15 μs, only one synthesizer 201 is needed in PHS transceiver 106, thereby saving power and area compared to typical transceivers.

Figure 5:
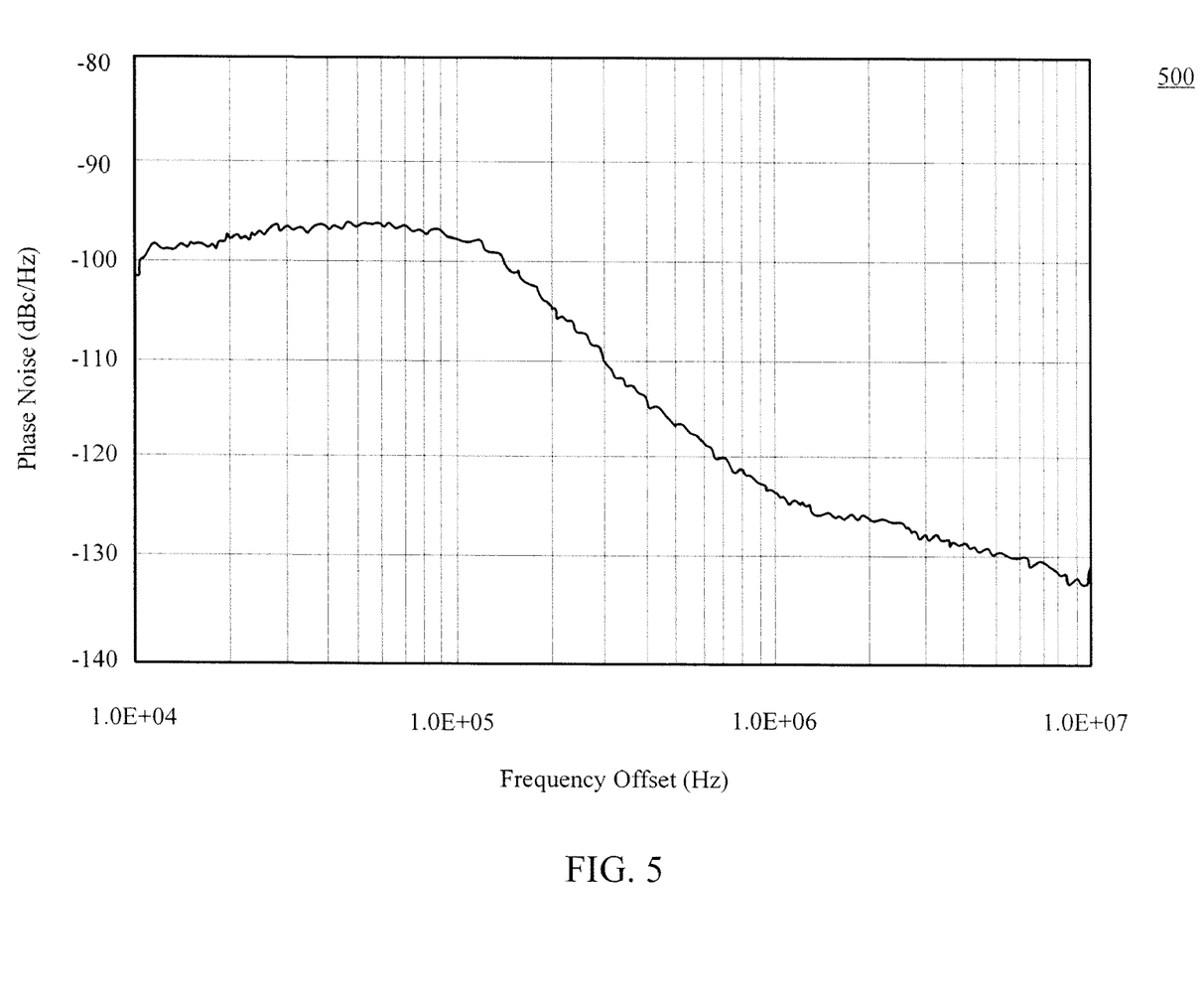
FIG. 5 illustrates a graph plotting phase noise (dBc/Hz) versus frequency offset (Hz) for an exemplary loop filter when providing a 120 kHz loop bandwidth.

Moreover, at a loop bandwidth of 120 kHz, the synthesizer phase noise measured at the transmitter output is relatively low. FIG. 5 illustrates a graph 500 plotting phase noise (dBc/Hz) versus frequency offset (Hz) for loop filter 208 when providing a 120 kHz loop bandwidth. As shown in graph 500, the phase noise is −98 dBc/Hz at 100 kHz offset (showing reference clock phase noise dominating) and −118 dBc/Hz at 600 kHz (showing $\Sigma\Delta$ quantization noise dominating).

Referring back to FIG. 2, receiver 203 converts an incoming RF signal (from antenna 209) to quadrature baseband outputs (I and Q) while providing enough gain and blocker attenuation for proper demodulation of the desired signal. In one embodiment, a low noise amplifier (LNA) 210 can include a cascoded differential pair with inductive degeneration and inductive loading. LNA 210 can have an adjustable RF gain to accommodate RF input signals as large as −5 dBm.

Subsequent RF gain stages (e.g. receiver variable gain amplifiers RxVGA1 and RxVGA2) can provide additional gain as well as gain steps for automatic gain control (AGC). AGC can be further aided through the use of on-chip peak detectors (i.e. envelope detection) at the output of the RF gain stages. In one embodiment, an RF loop back path 211 can be selectively provided from the transmit RF VGA (i.e. TxVGA 223) to receiver 203. RF loop back path 211 can allow receiver filter bandwidth and transmitter carrier leak to be calibrated, thereby advantageously reducing device matching requirements.

Receive mixers 212 and 213 receive the radio frequency signal (RF+ and RF−) generated by the receiver variable gain amplifiers (i.e. RxVGA1 and RxVGA2) as well as the local oscillator ($LO_{RF}$(Q) and $LO_{RF}$(I)) signals generated by LO buffers 230. Receive mixers 212 and 213 provide their baseband outputs to lowpass filters 214 and 215, respectively, which can be implemented by programmable-gain, active RC second-order Butterworth filters that provide 17 dB of attenuation at 600 kHz. Note that any DC offset in these outputs can be cancelled by offset digital-to-analog converters (DAC) 216/217, which are driven by the digital baseband (not shown). The filtered analog baseband signals output by lowpass filters 214/215 can be quantized by a set of second-order ΣΔ analog-to-digital converters (ADCs) 218/219. In one embodiment, ADCs 218/219 have an 80 dB dynamic range to accommodate large blockers that can be easily attenuated digitally.

Figure 6A:
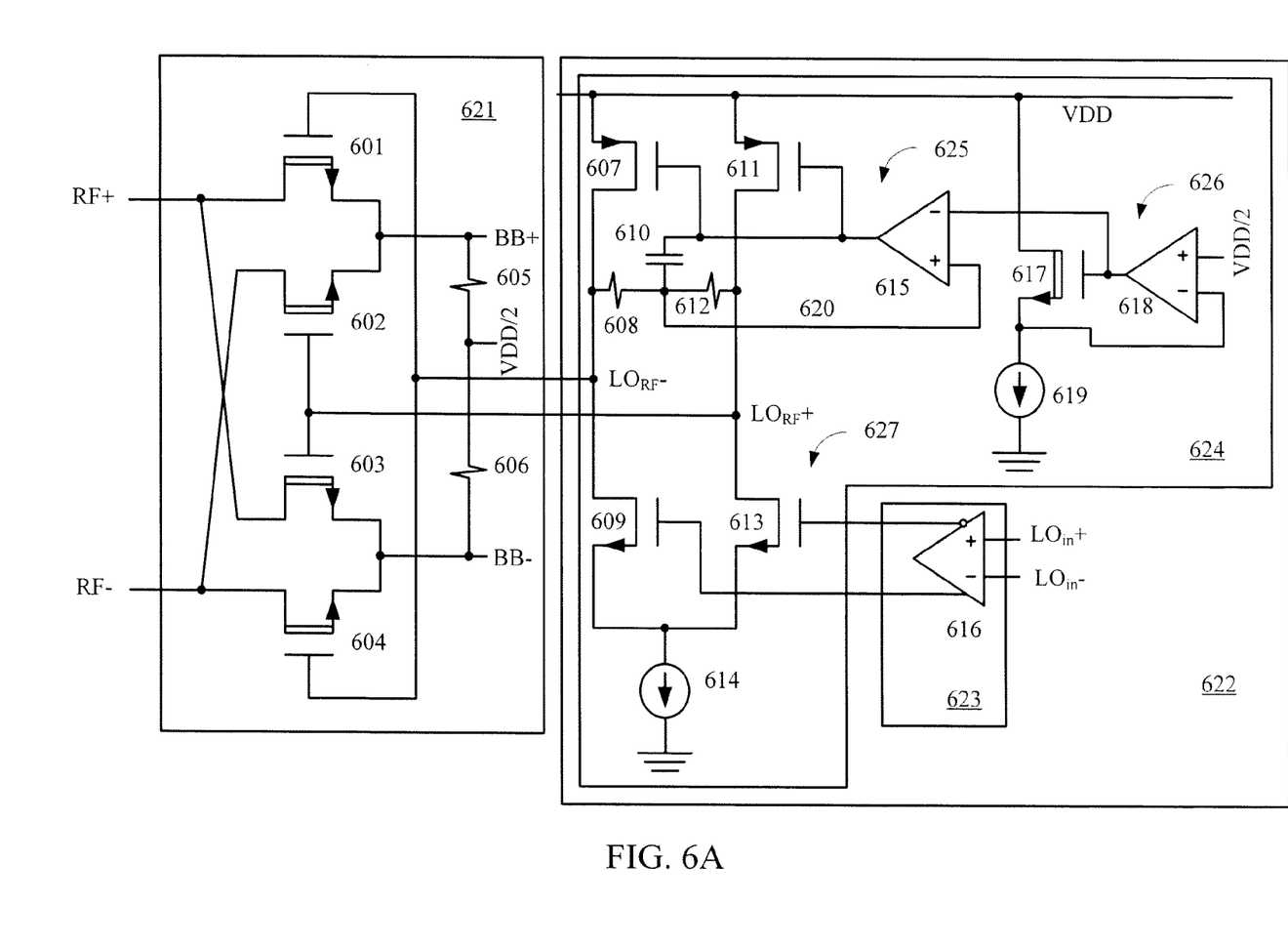
FIG. 6A illustrates an exemplary inductor-less local oscillator (LO) buffer that provides its outputs, i.e. $LO_{RF^-}$ and $LO_{RF^+}$, to a passive mixer.

FIG. 6A illustrates an exemplary inductor-less local oscillator (LO) buffer 622 that receives its inputs, i.e. $LO_{in}{}^+$ and $LO_{in}{}^-$, from a divider of divider circuit 205 (FIG. 2) and provides its outputs, i.e. $LO_{RF}{}^-$ and $LO_{RF}{}^+$, to a mixer 621. Note that each inphase (I) and quadrature (Q) signal has a positive and negative component, e.g. $LO_{RF}{}^-$(Q) and $LO_{RF}{}^+$(Q). Thus, FIG. 6A illustrates a generic mixer and LO buffer that can be implemented in either the I or Q paths of the receiver.

Mixer 621 can be characterized as "passive" because no DC voltage flows through it. Advantageously, the use of a passive, instead of an active mixer, effectively eliminates the flicker noise (1/f) from limiting the overall receiver sensitivity. In this embodiment, mixer 621 uses native (NMOS) transistors 601, 602, 603, and 604 to directly convert its input signals, i.e. radio frequency signals RF+ and RF− and the local oscillator signals $LO_{RF}{}^-$ and $LO_{RF}{}^+$, into output baseband signals, i.e. BB+ and BB−.

Mixer 621 provides these output baseband signals to a baseband filter (e.g. filter 212 or 213 as shown in FIG. 2) that is biased at VDD/2. As a result, for correct functioning in mixer 621, each gate of native transistors 601-604 should be biased to VDD/2 plus a threshold voltage of that device. In other words, the gate voltages of native transistors 601-604 are set at the edge of conduction. In this embodiment, these gate voltages are provided by the positive and negative components of the $LO_{RF}$ signal, as generated by inductor-less LO buffer 622. Note that the common-mode voltage and amplitude of the $LO_{RF}$ signal can also strongly influence the gain of mixer 621.

In one embodiment, inductor-less LO buffer 622 can include a first stage 623 as well as a final stage 624 comprising a common-mode feedback circuit 625, a replica bias circuit 626, and a gain circuit 627. Common-mode feedback circuit 625 includes two PMOS transistors 607 and 611, an operational amplifier 615, two resistors 608 and 612, and a capacitor 610. Transistors 607 and 611 have their sources connected to a VDD voltage source and their gates connected between an output terminal of operational amplifier 615 and a first terminal of capacitor 610. The second terminal of capacitor 610 is connected between resistors 608 and 612 as well as a positive input terminal of operational amplifier 615 via a common-mode feedback loop 620. The drains of transistors 607 and 611 are connected to resistors 608 and 612, respectively. Generally, resistors 608 and 612 are sized such that their output impedance does not reduce the gain while still ensuring stability in common-mode feedback loop 620.

In this configuration, resistors 608 and 612 can facilitate biasing the common-mode voltage. Operational amplifier 615 can then compare the common-mode voltage provided on its positive input terminal to a desired voltage provided on its negative input terminal. In this embodiment, the desired voltage is VDD/2+$V_{TH}$, which is generated by replica bias circuit 626. Using transistors 607 and 611, which serve as load devices, common-mode feedback circuit 624 can drive the common-mode voltage to the desired voltage of VDD/2+$V_{TH}$. Notably, common-mode feedback loop 620 is a negative feedback loop having more than one pole and therefore is connected to capacitor 610, which functions as a compensation capacitor. In general, capacitor 610 is sized to maintain an acceptable phase margin for common-mode feedback loop 620.

In this embodiment, replica bias circuit 626 includes an operational amplifier 618, a native (NMOS) transistor 617, and a current source 619. Operational amplifier 618 has a positive input terminal connected to VDD/2 (e.g. generated using a resistor ladder) and an output terminal connected to a gate of native transistor 617. The drain of native transistor 617 is connected to VDD whereas its source is connected to current source 619 (set to provide a small current on the order of 10 µA) (which in turn is connected to ground) as well as a negative input terminal of operational amplifier 618.

In this configuration, replica bias circuit 626 provides the above-described desired voltage, i.e. VDD/2+$V_{TH}$, wherein $V_{TH}$ is the threshold voltage of native transistor 617. Notably, as described above, mixer 621 is implemented with native (NMOS) transistors 601-604. Thus, the desired voltage generated by replica bias circuit 626 is also the DC operating point of mixer 621.

First stage 623 of inductor-less LO buffer 622, in this embodiment, includes a differential amplifier 616 that receives the LO input signal, i.e. $LO_{in}{}^+$ and $LO_{in}{}^-$, on its positive and negative input terminals, respectively, and provides its outputs to final stage 624. In a two-stage implementation of inductor-less LO buffer (as shown in FIG. 6A), final stage 624 forms the second stage. In this embodiment, two NMOS transistors 609 and 613 as well as a current source 614 form gain circuit 627. In one embodiment, the negative and positive outputs of differential amplifier 616 are connected to the gates of transistors 609 and 613, respectively. The sources of transistors 609 and 613 are connected to current source 614 (which in turn is connected to ground). The drains of transistors 609 and 613 are connected to the drains of transistors 607 and 611, respectively. Therefore, the combined outputs of gain circuit 627 and common-mode feedback circuit 624 generate the above-described $LO_{RF}{}^-$ and $LO_{RF}{}^+$ signals, which are then provided to mixer 621.

Figure 6B:
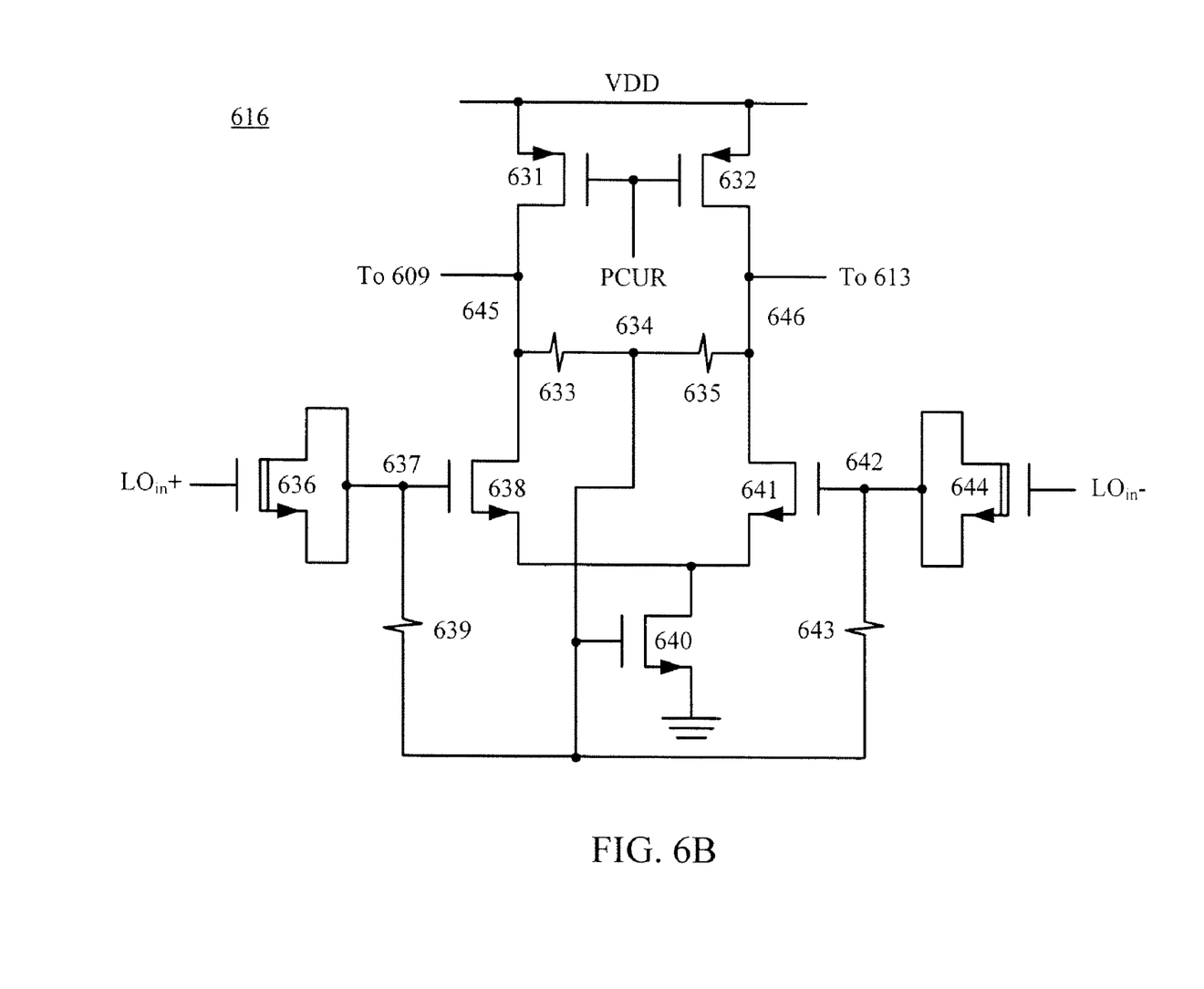
FIG. 6B illustrates an exemplary embodiment of a differential amplifier that can be used in the first stage of an inductor-less LO buffer.

FIG. 6B illustrates an exemplary embodiment of differential amplifier 616. In this embodiment, differential amplifier 616 includes two NMOS transistors 636 and 644 that receive the LO input signal, i.e. $LO_{in^+}$ and $LO_{in^-}$, on their respective gates. Transistor 636 has its source and drain commonly connected to a node 637, thereby forming a coupling capacitor. Similarly, transistor 644 has its source and drain commonly connected to a node 642, thereby forming another coupling capacitor. In one embodiment, transistors 636 and 644 can be implemented as native transistors.

Node 637 is connected to a gate of an NMOS transistor 638 as well as to a resistor 639. Node 642 is connected to a gate of an NMOS transistor 641 as well as a resistor 643. Resistors 639 and 643 are commonly connected to a gate of an NMOS transistor 640 as well as to a node 634. Transistor 640 is connected between ground and the commonly connected sources of transistors 638 and 641. The drains of transistors 638 and 641 are connected to nodes 645 and 646, respectively. A resistor 633 is connected between nodes 645 and 634 whereas a resistor 635 is connected between nodes 646 and 634. Two PMOS transistors 631 and 632 are connected between VDD and nodes 645 and 646, respectively. In this embodiment, transistors 631 and 632 both receive a voltage PCUR on their gates, which biases those transistors to conduct, thereby forming current sources. Note that nodes 645 and 646 form the negative and positive output terminals, respectively, of differential amplifier 616. Further note that resistors 633 and 635 and transistor 640 form a common-mode feedback for first stage 623 (FIG. 6A), thereby advantageously eliminating any capacitive coupling on the lines connected to transistors 609 and 613.

Figure 6C:
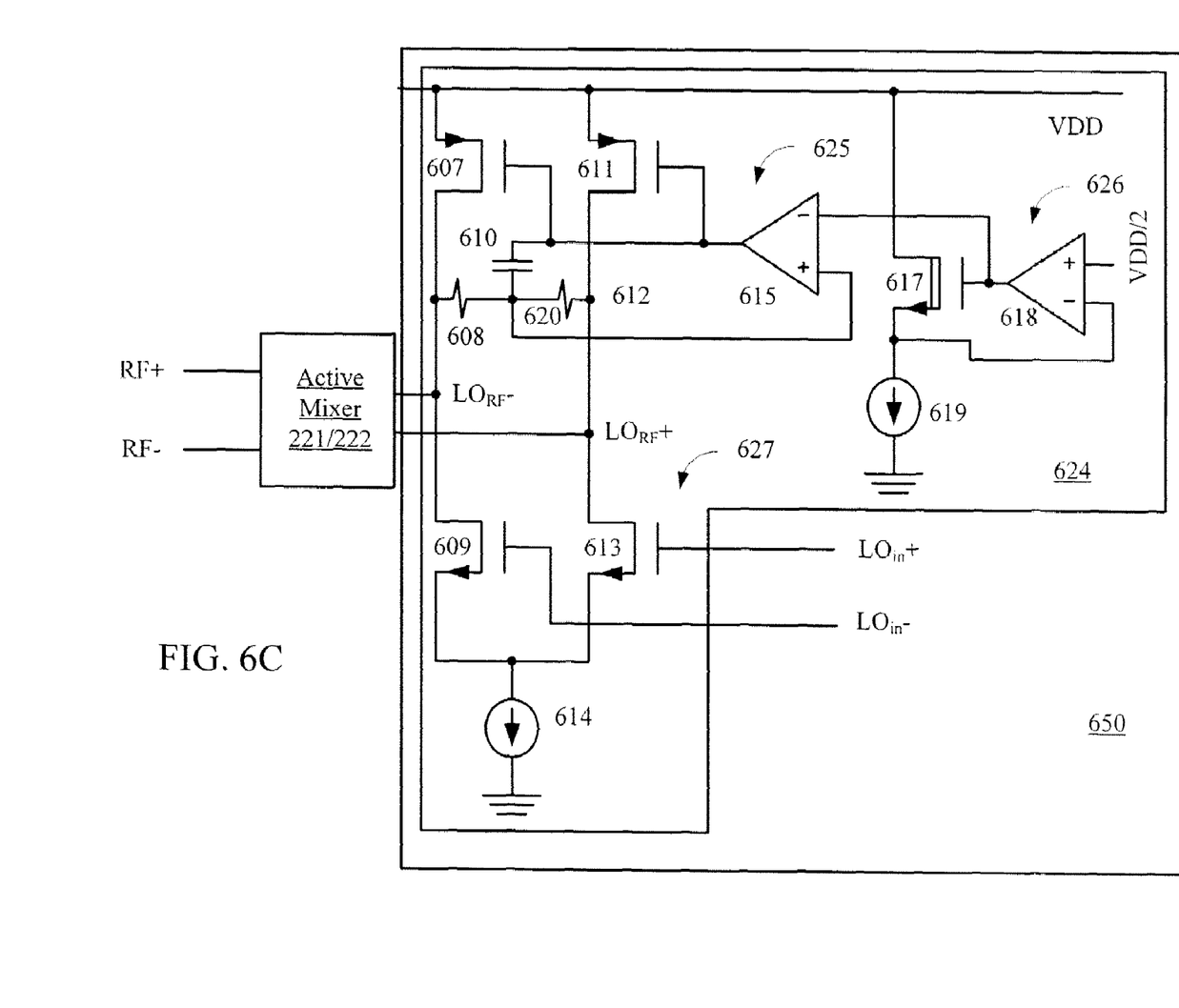
FIG. 6C illustrates an exemplary single stage inductor-less LO buffer that includes a replica bias circuit as well as a common-mode feedback circuit.

Note that although a two-stage inductor-less LO buffer is described in reference to FIG. 6A, a single stage inductor-less LO buffer can also be used in PHS transceiver 106. For example, FIG. 6C illustrates an exemplary single stage inductor-less LO buffer 650. Note that LO buffer 650 includes only final stage 624 (comprising common-mode feedback circuit 625, replica bias circuit 626, and gain circuit 627 as described in reference to FIG. 6A), but eliminates first stage 623. In this embodiment, transistors 613 and 609 can receive (directly or through coupling capacitors) $LO_{in^+}$ and $LO_{in^-}$, respectively. Thus, an N-stage inductor-less LO buffer (where N is a positive integer) includes N−1 differential amplifiers (i.e. non-final stages) connected in series and final stage 624 is the last stage.

In one embodiment, an inductor-less LO buffer, similar to that in FIG. 6A or 6C, can be used to generate the LO signals for a pair of active transmit mixers 221/222 (FIG. 2) that convert the baseband currents directly to 1.9 GHz. Referring back to FIG. 2, a variable gain amplifier (TxVGA) 223 preceding an on-chip power amplifier (PA) 224 can advantageously compensate for gain variation over process and temperature.

In one embodiment, an external (i.e. off-chip) power amplifier (XPA) output stage can include four cascaded segments to enable power-efficient adjustment of gain and output power. Note that turning off a cascaded segment, e.g. by grounding the gate of a cascode transistor, can result in large drain-gate voltage (VDG) stress if a large voltage swing is present at the output drain node. In one implementation, each cascoded segment can be enabled by a switch in series with ground to avoid reliability concerns.

In transmitter 202, the digital baseband signal is up-converted by two 9-bit, 38.4 MS/s, current-steering DACs 220 into I and Q baseband currents. Notably, because of a high sampling frequency, no explicit low-pass filtering is necessary to remove DAC spectral images.

Figure 7:
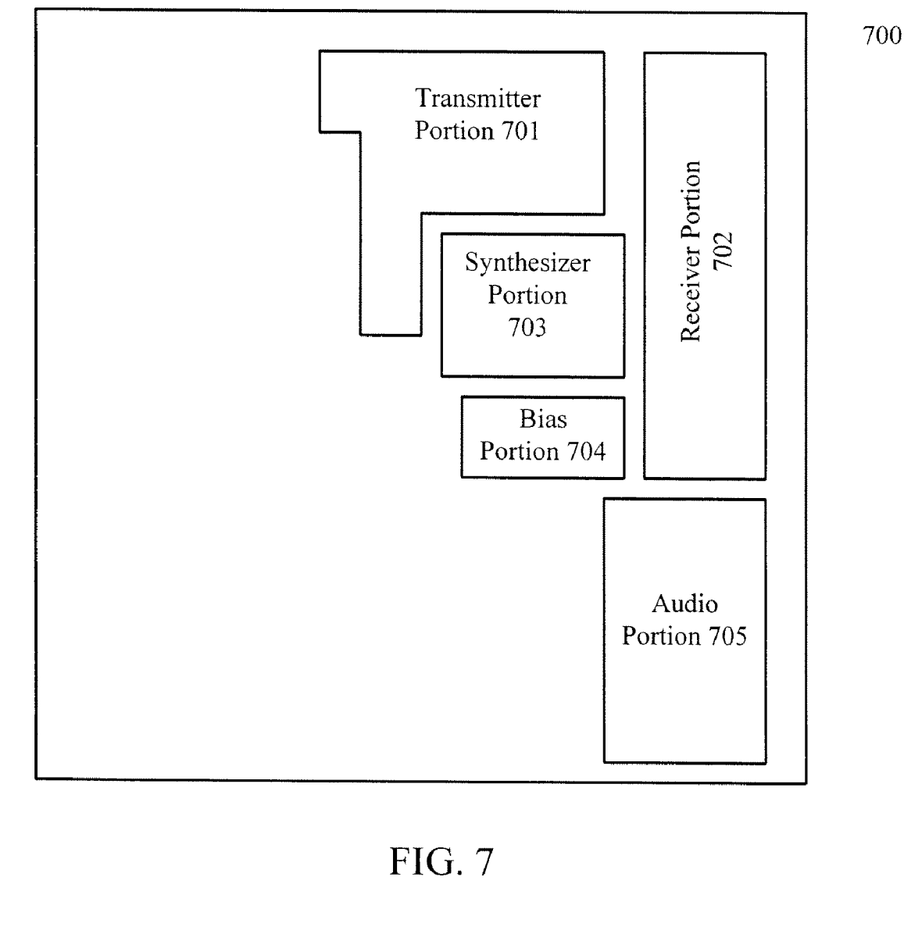
FIG. 7 illustrates an exemplary die floorplan for a single-chip PHS cellphone implementation.

FIG. 7 shows an exemplary die floorplan 700 for a single-chip PHS cellphone implementation. Die floorplan 700 can include a transmitter portion 701, a receiver portion 702, a synthesizer portion 703, a bias portion 704 (that provides constant bias currents needed to bias various blocks throughout the chip), and an audio portion 705 (e.g. including voice subsystem 108 and converters 109, as described in FIG. 1). In one embodiment, die floorplan 700 occupies a total die area of 35 mm$^2$ in a standard 0.18 μm CMOS technology with the above-described analog portions occupying approximately 12 mm$^2$. The PHS cellphone implementation based on die floorplan 700 can be packaged in a 276-pin ball grid array (BGA).

Figure 8:
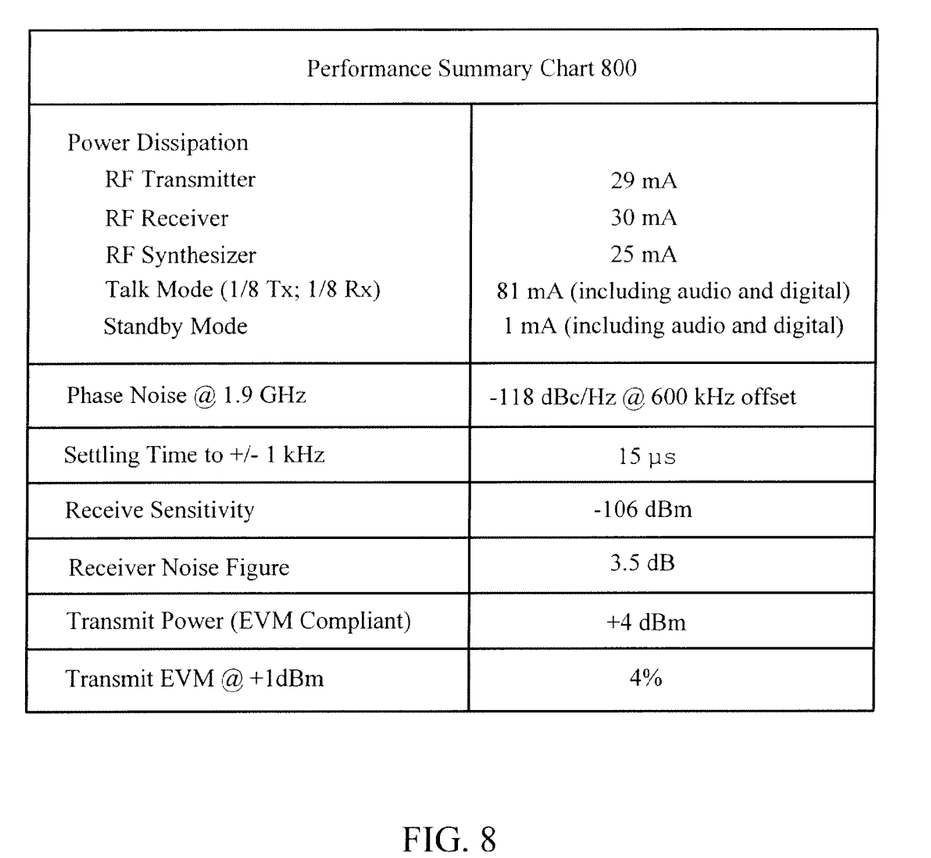
FIG. 8 illustrates a chart of the exemplary measured performance of the PHS cellphone implementation (including the two-stage inductor-less LO buffer) described herein.

Exemplary measured performance of the PHS cellphone implementation described herein (including the two-stage inductor-less LO buffer) is summarized in a chart 800 shown in FIG. 8. As noted previously, the above-described PHS cellphone has a fast settling time (i.e. 15 μs to +/−1 kHz) as well as low phase noise (i.e. at 1.9 GHz, −118 dBc/Hz at 600 kHz offset). Moreover, power dissipation is notably low in all components and modes, e.g. 29 mA in the RF transmitter, 30 mA in the RF receiver, 25 mA in the RF synthesizer, 81 mA in the talk mode, and 1 mA in the standby mode. Additionally, the above-described PHS cellphone has a +4 dBm EVM-compliant transmit power, a −106 dBm receive sensitivity (including loss due to an off-chip transmit/receive switch), and a relatively low receiver noise figure of 3.5 dB.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although coupling capacitors implemented with native transistors can be used in the above-described differential amplifier, standard metal capacitors can also be used with a corresponding increase in die area. Accordingly, it is intended that the scope of the invention be defined by the following Claims and their equivalents.

The invention claimed is:

1. An inductor-less local oscillator (LO) buffer comprising:
 a differential amplifier receiving a first component of the LO input signal on its positive input terminal and a second component of the LO input signal on its negative input terminal;
 a first transistor having a gate, a source, and a drain, wherein the gate is connected to a negative output terminal of the differential amplifier, and wherein the drain is connected to a positive LO output terminal of the LO buffer;
 a second transistor having a gate, a source, and a drain, wherein the gate is connected to a positive output terminal of the differential amplifier, and wherein the drain is connected to a negative LO output terminal of the LO buffer;
 a first current source connected between a first voltage source and the sources of the first and second transistors;
 a third transistor having a gate, a source, and a drain, wherein the source is connected to a second voltage source, and wherein the drain is connected to the positive LO output terminal;
 a fourth transistor having a gate, a source, and a drain, wherein the source is connected to the second voltage source, and wherein the drain is connected to the negative LO output terminal;
 a first resistor connected between the positive LO output terminal and a first node;

a second resistor connected between the negative LO output terminal and the first node;
a capacitor connected between the gates of the third and fourth transistors and the first node;
a first operational amplifier having an output terminal connected to the gates of the third and fourth transistors, a positive input terminal connected to the first node, and a negative input terminal;
a second operational amplifier having an output terminal connected to the negative input terminal of the first operational amplifier, a positive input terminal connected to predetermined voltage, and a negative input terminal;
a second current source connected between the first voltage source and the negative input terminal of the second operational amplifier; and
a native transistor having a gate connected to the output terminal of the second operational amplifier, a source connected to the negative input terminal of the second operational amplifier, and a drain connected to the second voltage source.

2. An N-stage inductor-less local oscillator (LO) buffer comprising:
N−1 non-final stages, wherein N is a positive integer; and
a final stage including:
a first transistor having a gate, a source, and a drain, wherein the gate is connected to one of a first component of an LO input signal if N=1 and a first output of a non-final stage if N>1, and wherein the drain is connected to a first LO output terminal of the LO buffer;
a second transistor having a gate, a source, and a drain, wherein the gate is connected to one of a second component of the LO input signal if N=1 and a second output of the non-final stage if N>1, and wherein the drain is connected to a negative LO output terminal of the LO buffer;
a first current source connected between a first voltage source and the sources of the first and second transistors;
a third transistor having a gate, a source, and a drain, wherein the source is connected to a second voltage source, and wherein the drain is connected to the positive LO output terminal;
a fourth transistor having a gate, a source, and a drain, wherein the source is connected to the second voltage source, and wherein the drain is connected to the negative LO output terminal;
a first resistor connected between the positive LO output terminal and a first node;
a second resistor connected between the negative LO output terminal and the first node;
a capacitor connected between the gates of the third and fourth transistors and the first node;
a first operational amplifier having an output terminal connected to the gates of the third and fourth transistors, a positive input terminal connected to the first node, and a negative input terminal;
a second operational amplifier having an output terminal connected to the negative input terminal of the first operational amplifier, a positive input terminal connected to predetermined voltage, and a negative input terminal;
a second current source connected between the first voltage source and the negative input terminal of the second operational amplifier; and
a native transistor having a gate connected to the output terminal of the second operational amplifier, a source connected to the negative input terminal of the second operational amplifier, and a drain connected to the second voltage source.

3. An N-stage inductor-less local oscillator (LO) buffer comprising:
N−1 non-final stages, wherein N is a positive integer; and
a final stage including:
a gain circuit;
a common-mode feedback circuit connected to the gain circuit; and
a replica bias circuit that provides a predetermined voltage to the common-mode feedback circuit, thereby allowing the common-mode feedback circuit to drive a common-mode voltage to the predetermined voltage.

4. The N-stage inductor-less LO buffer of claim 3, wherein each of the N−1 non-final stages includes a differential amplifier.

5. The N-stage inductor-less LO buffer of claim 4, wherein in a first stage the differential amplifier receives a first component of an LO input signal on its positive input terminal and a second component of the LO input signal on its negative input terminal, and wherein the differential amplifier provides its outputs to one of another non-final stage if N>2 and the final stage if N=2.

6. The N-stage inductor-less LO buffer of claim 5, wherein the differential amplifier includes:
a first coupling capacitor having a first terminal and a second terminal, the first terminal receiving the first component of the LO input signal;
a second coupling capacitor having a first terminal and a second terminal, the first terminal receiving the second component of the LO input signal;
a first transistor having a gate, a source, and a drain, the gate being connected to the second terminal of the first coupling capacitor;
a second transistor having a gate, a source, and a drain, the gate being connected to the second terminal of the second coupling capacitor;
a third transistor having a gate, a source, and a drain, the drain being connected to the sources of the first and second transistors, and the source being connected to a first voltage source;
a first resistor connected between the second terminal of the first coupling capacitor and the gate of the third transistor;
a second resistor connected between the second terminal of the second coupling capacitor and the gate of the third transistor;
a fourth transistor having a gate, a source, and a drain, the source being connected to a second voltage source and the drain being connected to the drain of the first transistor;
a fifth transistor having a gate, a source, and a drain, the source being connected to the second voltage source, the drain being connected to the drain of the second transistor, and the gate being connected to the gate of the fourth transistor and a bias terminal;
a third resistor connected between the drains of the first and fourth transistors and a gate of the third transistor; and
a fourth resistor connected between the drains of the second and fifth transistors and the gate of the third transistor.

7. The N-stage inductor-less LO buffer of claim 6, wherein the first and second coupling capacitors are implemented as native transistors.

8. The N-stage inductor-less LO buffer of claim 5, wherein the differential amplifier includes:
- a first coupling capacitor having a first terminal and a second terminal, the first terminal receiving the first component of the LO input signal;
- a second coupling capacitor having a first terminal and a second terminal, the first terminal receiving the second component of the LO input signal;
- a first transistor having a gate, a source, and a drain, the gate being connected to the second terminal of the first coupling capacitor;
- a second transistor having a gate, a source, and a drain, the gate being connected to the second terminal of the second coupling capacitor;
- a third transistor having a gate, a source, and a drain, the drain being connected to the sources of the first and second transistors, and the source being connected to a first voltage source;
- a first resistor connected between the second terminal of the first coupling capacitor and the gate of the third transistor;
- a second resistor connected between the second terminal of the second coupling capacitor and the gate of the third transistor;
- a first current source connected between a second voltage source and the drain of the first transistor;
- a second current source connected between the second voltage source and the drain of the second transistor;
- a third resistor connected between the drain of the first transistor and a gate of the third transistor; and
- a fourth resistor connected between the drain of the second transistor and the gate of the third transistor.

9. The N-stage inductor-less LO buffer of claim 8, wherein the first and second coupling capacitors are implemented as native transistors.

10. The N-stage inductor-less LO buffer of claim 3, wherein the gain circuit includes:
- a first transistor having a gate, a source, and a drain, wherein the gate receives one of a first component of an LO input signal if N=1 and a first output of a non-final stage if N>1, and wherein the drain is connected to a first LO output terminal of the LO buffer;
- a second transistor having a gate, a source, and a drain, wherein the gate receives one of a second component of the LO input signal if N=1 and a second output of the non-final stage if N>1, and wherein the drain is connected to a negative LO output terminal of the LO buffer; and
- a first current source connected between a first voltage source and the sources of the first and second transistors.

11. The N-stage inductor-less LO buffer of claim 10, wherein the common-mode feedback circuit includes:
- a third transistor having a gate, a source, and a drain, wherein the source is connected to a second voltage source, and wherein the drain is connected to the positive LO output terminal;
- a fourth transistor having a gate, a source, and a drain, wherein the source is connected to the second voltage source, and wherein the drain is connected to the negative LO output terminal;
- a first resistor connected between the positive LO output terminal and a first node;
- a second resistor connected between the negative LO output terminal and the first node;
- a capacitor connected between the gates of the third and fourth transistors and the first node; and
- a first operational amplifier having an output terminal connected to the gates of the third and fourth transistors, a positive input terminal connected to the first node, and a negative input terminal.

12. The N-stage inductor-less LO buffer of claim 11, wherein the replica bias circuit includes:
- a second operational amplifier having an output terminal connected to the negative input terminal of the first operational amplifier, a positive input terminal connected to mixer bias voltage, and a negative input terminal;
- a second current source connected between the first voltage source and the negative input terminal of the second operational amplifier; and
- a native transistor having a gate connected to the output terminal of the second operational amplifier, a source connected to the negative input terminal of the second operational amplifier, and a drain connected to the second voltage source.

* * * * *